(12) United States Patent
Kobayashi et al.

(10) Patent No.: US 7,405,690 B2
(45) Date of Patent: Jul. 29, 2008

(54) ANALOG-TO-DIGITAL CONVERTER

(75) Inventors: Shigeto Kobayashi, Gifu (JP); Kuniyuki Tani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/700,245

(22) Filed: Jan. 31, 2007

(65) Prior Publication Data

US 2007/0188368 A1    Aug. 16, 2007

(30) Foreign Application Priority Data

Jan. 31, 2006  (JP) .............................. 2006-022495

(51) Int. Cl.
*H03M 1/14*   (2006.01)
(52) U.S. Cl. ...................... 341/156; 341/161
(58) Field of Classification Search ................. 341/156, 341/161, 162, 163
See application file for complete search history.

(56) References Cited

U.S. PATENT DOCUMENTS 7,199,745 B2 *    4/2007   Tachibana et al. ........... 341/163
2007/0035434 A1 *  2/2007   Tachibana et al. ........... 341/161
2007/0176817 A1 *  8/2007   Kobayashi ................... 341/155

FOREIGN PATENT DOCUMENTS

JP         9-275342 A     10/1997

* cited by examiner

*Primary Examiner*—Howard Williams
(74) *Attorney, Agent, or Firm*—McDermott Will & Emery LLP (57) ABSTRACT

An A-D converter includes a first amplifier circuit, an A-D converter circuit, a D-A converter circuit, a subtraction circuit, a second amplifier circuit, a timing control circuit, a type control unit, an output unit. The type control unit sets the type of the A-D converter circuit at the time of conversion to the higher 4 bits, to a type in which either one of an analog signal or a reference voltage is inputted selectively to a comparator via a capacitor. The type control unit performs a control so that the type of the A-D converter circuit at the time of conversion to values of the higher 5th to 7th bits and the higher 8th to 10th bits from the most significant bit, to a type in which an analog signal and a reference voltage are inputted fixedly to a comparator without involving a capacitor.

7 Claims, 9 Drawing Sheets

| A-D CONVERTER CIRCUIT 12 | D 9 ~ D 6 | D 5 ~ D 3 | D 2 ~ D 0 | D 9 ~ D 6 | D 5 ~ D 3 | D 2 ~ D 0 |
|---|---|---|---|---|---|---|
| TYPE OF OPERATION | CAPACITANCE-INPUT TYPE | GATE-INPUT TYPE | GATE-INPUT TYPE | CAPACITANCE-INPUT TYPE | GATE-INPUT TYPE | GATE-INPUT TYPE |

ANALOG-TO-DIGITAL CONVERTER

BACKGROUND OF THE INVENTION

1. Field of the Invention

The present invention generally relates to analog-to-digital converters and it particularly relates to an analog-to-digital converter in which analog signals are converted to digital signals in such a manner that the analog signal is converted a plurality of times.

2. Description of the Related Art

As an example of a circuit for converting the inputted analog signals into the digital signals, there is available a pipeline-type A-D converter. A pipeline-type A-D converter is configured such that sub-A-D converters of low bits are connected in a plurality of stages. The inputted analog signal is A-D converted in stages through the respective sub-A-D converters. Each sub-A-D converter is provided with a plurality of comparators, and each comparator compares the inputted analog signal with the reference voltage so as to convert the analog signal into the digital signals.

In the analog-to-digital converter, the enhancement of the conversion accuracy and the reduction of the power consumption are both desired. However, the enhancement of the conversion accuracy and the reduction of the power consumption are generally in a trade-off relation to each other. In the light of this trade-off relation, a structure that realizes the both has been a major issue.

SUMMARY OF THE INVENTION

The present invention has been made in recognition of the aforementioned circumstances and a general purpose thereof is to optimize the structure of an analog-to-digital converter.

In order to resolve the above problems, an analog-to-digital converter according to one embodiment of the present invention converts an input analog signal to a digital value of a predetermined number of bits, the analog-to-digital converter, and it is configured to be operable by a first mode and second mode wherein the first mode is such that an analog signal is inputted, via a capacitor, to a comparator included in said analog-to-digital converter and the second mode is such that an analog signal is inputted, without involving a capacitor, to a comparator included in said analog-to-digital converter.

Another embodiment of the present invention relates also to an analog-to-digital converter. This analog-to-digital converter converts an input analog signal to a digital value of a predetermined number of bits as a result of a plurality of conversions, and it comprises: a conversion unit which converts the input analog signal to a digital value of less than the predetermined number of bits wherein the conversion unit is put to a common use for at least two conversions in a plurality of conversions; and a control unit which switches between a first type and a second type wherein the first type is such that an analog signal is inputted, via a capacitor, to a comparator included in the conversion unit and the second type is such that an analog signal is inputted, without involving a capacitor, to a comparator included in the conversion unit.

Still another embodiment of the present invention relates also to an analog-to-digital converter. This analog-to-digital converter converts an input analog signal to a digital value of a predetermined number of bits as a result of a plurality of conversions through a plurality of stages connected in series, and the plurality of stages include: a first stage including a first-type conversion unit which has the analog signal inputted to a comparator of the first-type conversion unit via a capacitor; and a second stage including a second-type conversion unit which has the analog signal inputted to a comparator of the second-type conversion unit without involving a capacitor.

It is to be noted that any arbitrary combination of the above-described structural components and expressions converted among a method, an apparatus, a system and so forth are all effective as and encompassed by the present embodiments.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

A preferred embodiment according to the present invention relates to an analog-to-digital converter (hereinafter referred to as "A-D converter") which converts an inputted analog signal into digital signals in stages. This A-D converter uses two operation types in parallel when an analog signal inputted to the A-D converter circuit is compared with a reference voltage. That is, two operations are carried out in a combined manner. One operation type (hereinafter referred to as "capacitance-input type") is such that either the analog signal or reference voltage is selectively inputted to a comparator by way of a capacitor. The other operation type (hereinafter referred to as "gate-input type") is such that the analog signal and the reference voltage are fixedly inputted to a comparator without involving a capacitor. Thereby, the structure of the A-D converter can be optimized by utilizing the advantages of the capacitance-input type operation and the gate-input type operation.

OUTLINE OF THE EMBODIMENT

An analog-to-digital converter according to one preferred embodiment of the present invention converts an input analog signal to a digital value of a predetermined number of bits, the analog-to-digital converter, and it is configured to be operable by a first mode and second mode wherein the first mode is such that an analog signal is inputted, via a capacitor, to a comparator included in said analog-to-digital converter and the second mode is such that an analog signal is inputted, without involving a capacitor, to a comparator included in said analog-to-digital converter.

According to this embodiment, in the first mode the timing at which the inputted analog signal is sampled can be appropriately determined, so that the conversion accuracy can be enhanced. In the second mode, the required capacity of an amplifier for driving the capacitance can be reduced and therefore the power consumption can be suppressed. Accordingly, using these two modes properly allows to optimize the structure of the analog-to-digital converter so that two demands of the enhancement of the conversion accuracy and the reduction of the power consumption are met.

Another preferred embodiment of the present invention relates also to an analog-to-digital converter. This analog-to-digital converter converts an input analog signal to a digital value of a predetermined number of bits as a result of a plurality of conversions, and it comprises: a conversion unit which converts the input analog signal to a digital value of less than the predetermined number of bits wherein the conversion unit is put to a common use for at least two conversions in a plurality of conversions; and a control unit which switches between a first type and a second type wherein the first type is such that an analog signal is inputted, via a capacitor, to a comparator included in the conversion unit and the second type is such that an analog signal is inputted, without involving a capacitor, to a comparator included in the conversion unit.

According to this embodiment, in the case when the operation type of the converter unit is set to the first type, the timing at which the analog signal is sampled in the conversion unit is determined appropriately. Hence the conversion accuracy can be improved. In the case when the operation type of the converter unit is set to the second type, the required capacity of an amplifier for driving the capacitance can be reduced and the power consumption can be suppressed. As a result, switching the operation type of the conversion unit appropriately by the control unit between the first type and the second type can optimize the structure of the analog-to-digital converter by utilizing the advantages of the first type and the second type.

The conversion unit may include: a differential amplifier; a first input path which inputs selectively either the input analog signal or a reference voltage to the differential amplifier via a capacitor; a second input path which inputs fixedly either the input analog signal or the reference voltage to the differential amplifier without involving a capacitor; and a switch which connects either the first input path or the second input path to an input terminal of the differential amplifier. By controlling the switch, the control unit may switch the path connected to the input terminal of the differential amplifier between the first input path and the second input path. By implementing this structure, the differential amplifier can be shared in the case when the operation type of the conversion unit is switched from the first type to the second type, so that the circuit scale can be reduced.

Still another preferred embodiment of the present invention relates also to an analog-to-digital converter. This analog-to-digital converter converts an input analog signal to a digital value of a predetermined number of bits as a result of a plurality of conversions through a plurality of stages connected in series, and the plurality of stages include: a first stage including a first-type conversion unit which has the analog signal inputted to a comparator of the first-type conversion unit via a capacitor; and a second stage including a second-type conversion unit which has the analog signal inputted to a comparator of the second-type conversion unit without involving a capacitor.

According to this embodiment, in the first stage the timing at which the analog signal is sampled can be determined appropriately, so that the conversion accuracy can be improved. In the second stage, the required capacity of an amplifier for driving the capacitance can be reduced and the power consumption can be suppressed. As a result, arranging appropriately the first stage and the second stage can optimize the structure of the analog-to-digital converter by utilizing the advantages of the first type and the second type.

The first stage may be an initial stage in the plurality of stages. In such a case, the inputted analog signal is first converted to a digital value in the first stage. Thereby, the analog signal inputted to be converted can be sampled appropriately in the first stage and thus the accuracy of the analog-to-digital converter can be increased.

The conversion unit included in the first stage may be shared in two or more conversions in a plurality of conversions, and the analog-to-digital converter may include a control unit which switches the type of the conversion unit included in the first stage from the first type to the second type after the first conversion of the two or more conversions has been performed. In this case, sharing the conversion unit included in the first stage for two or more conversions can achieve the reduction of circuit scale. The conversion unit in the first stage operates under the first type in the first conversion where the sampling function plays the important role. After this first conversion, the operation type of the conversion unit is switched to the second type. Thereby, the conversion accuracy can be enhanced and at the same time the power consumption can be reduced.

The conversion unit included in the first stage may include: a differential amplifier; a first input path which inputs selectively either the input analog signal or a reference voltage to the differential amplifier via a capacitor; a second input path which inputs fixedly either the input analog signal or the reference voltage to the differential amplifier without involving a capacitor; and a switch which connects either the first input path or the second input path to an input terminal of the differential amplifier. By controlling the switch, the control unit may switch the path connected to the input terminal of the differential amplifier, from the first input path to the second input path. According to this structure, the differential amplifier can be shared in the case when the operation type of conversion unit is switched from the first type to the second type, so that the circuit scale can be reduced.

First Embodiment

Figure 1:
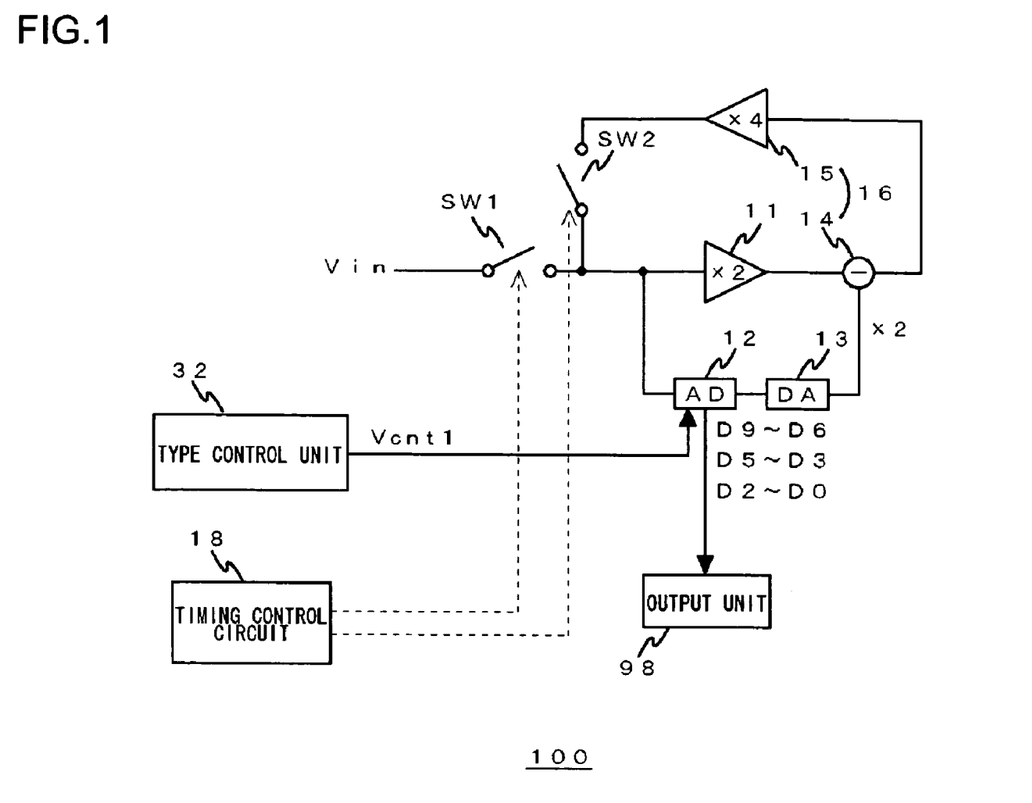
FIG. 1 is a circuit diagram showing a structure of an A-D converter according to a first embodiment of the present invention.

In a first embodiment, a description is given of a case where the above-described capacitance-input type and gate-input type are used, in combination, in a single A-D converter circuit. FIG. 1 illustrates a structure of an A-D converter 100 according to the first embodiment. The A-D converter 100 is comprised of a first switch SW1, a second switch SW2, a first amplifier circuit 11, an A-D converter circuit 12, a D-A converter circuit 13, a subtraction circuit 14, a second amplifier circuit 15, a timing control circuit 18, a type control unit 32, and an output unit 98.

An analog signal Vin is inputted to the first amplifier circuit 11 and the A-D converter 12 via the first switch SW1. The timing at which the first switch SW1 is turned on and off is given by the timing control circuit 18. The A-D converter circuit 12 converts the analog signal Vin to a digital value of maximum 4 bits and then the converted signal is outputted to the D-A converter circuit 13. The D-A converter circuit 13 converts the digital value of maximum 4 bits outputted from the A-D converter circuit 12, into an analog signal.

The first amplifier circuit 11 amplifies the analog signal Vin. The gain of the first amplifier circuit 11 is 2×. The subtraction circuit 14 subtracts the output of the D-A converter circuit 13 from the output of the first amplifier circuit 11. Here, the analog value outputted from the D-A converter 13 is amplified by the factor of 2 in correspondence with the gain of the first amplifier circuit 11. The second amplifier circuit 15 amplifies the output of the subtraction circuit 14. The output of the second amplifier circuit 15 is fed back to the first amplifier circuit 11 and the A-D converter circuit 12 via the second switch SW2. The timing at which the second switch SW2 is turned on and off is given by the timing control circuit 18. Note that in place of the subtraction circuit 14 and the second amplifier circuit 15 there may be provided a subtractor-amplifier circuit 16 which is an amplifier circuit provided with a subtraction function. According to this configuration, the circuitry can be simplified.

The output of the second amplifier circuit 15 which has been fed back via the second switch SW2 is inputted to the first amplifier circuit 11 and the A-D converter circuit 12. The A-D converter circuit 12 converts the fed-back analog value to a digital value of 3 bits, so as to be outputted to the D-A converter circuit 13. The first amplifier circuit 11 amplifies the fed-back analog value. The subtraction circuit 14 subtracts the output of the D-A converter circuit 13 from the output of the first amplifier circuit 11. The second amplifier circuit 15 amplifies the output of the subtraction circuit 14. The output of the second amplifier circuit 15 is fed back to the first amplifier circuit 11 and the A-D converter circuit 12 via the second switch SW2.

The number of cyclic processings by the feedback of the second amplifier circuit 15 is two. That is, the A-D converter 100 according to the first embodiment converts the analog signal Vin to the digital value of 10 bits in three steps. At a first step which is the initial step taken in the processing, the first switch SW1 is turned on and the second switch SW2 is turned off. In the first step, the A-D converter circuit 12 generates the higher 1st to 4th bits (D9 to D6), from the most significant bit, of 10-bit digital value that the A-D converter 100 will finally output. In a second and a third step, the first switch SW1 is turned off and the second switch SW2 is turned on. In the second and the third step, the A-D converter circuit 12 generates the higher 5th to 7th bits (D5 to D3) and the higher 8th to 10th bits (D2 to D0), from the most significant bit, of 10-bit digital value that the A-D converter 100 will finally output. The conversion by the A-D converter circuit 12 in the third step corresponds to the conversion to the least significant bit. The digital values (D9 to D6, D5 to D3, D2 to D0) outputted sequentially from the A-D converter circuit 12 are inputted to the output unit 98. The output unit 98 corrects the inputted digital values, based on a redundancy range described later. The output unit 98 outputs the corrected digital values parallely.

A redundancy range is provided in the conversion by the A-D converter circuit 12 at the second and the third step. Thus, the result of conversion by the A-D converter circuit 12 at the first and the second step can be corrected based on the result of conversion by the A-D converter circuit 12 at the second and the third step. In generalization, the result of conversion by the converter circuit 12 at a given step can be corrected based on the result of conversion by the A-D converter 12 at a step after said given step. Note that the correction based on the redundancy range is a known technique and therefore the detailed explanation thereof is omitted here. As will be discussed later, the type control unit 32 switches the operation type of the A-D converter circuit 12 according to the conversion step in the A-D converter 100.

Figure 2:
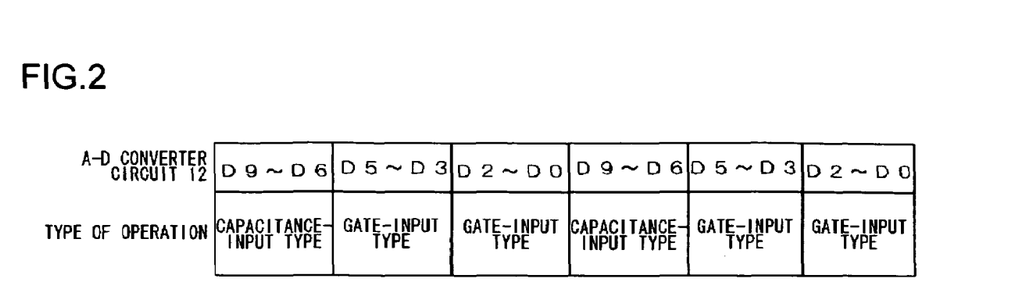
FIG. 2 illustrates a temporal change in an operation type of an A-D converter circuit shown in FIG. 1.

FIG. 2 illustrates a temporal change in the operation type of the A-D converter circuit 12 shown in FIG. 1. The type control unit 32 of FIG. 1 performs a control in a manner that the type of the A-D converter circuit 12 at the time of conversion to the higher 4 bits (D9 to D6) from the most significant bit is set to the capacitance-input type. On the other hand, the type control unit 32 performs a control in a manner that the type of the A-D converter circuit 12 at the time of conversion to the 5th to 7th bits (D5 to D3) and 8th to 10th bits (D2 to D0) from the most significant bit is set to the gate-input type.

The level of the analog signal Vin, to be converted, inputted via the first switch SW1 is constantly moving and changing. Accordingly, in order to enhance the conversion accuracy, it is important for the A-D converter circuit 12 and the first amplifier circuit 11 to sample the analog signal Vin at the same timing. In the light of this, in the first embodiment the operation type of the A-D converter circuit 12 is set to the capacitance-input type when the A-D converter circuit 12 converts the analog signal Vin inputted via the first switch SW1 into a digital value. In this manner, the timing at which the analog signal is sampled is determined by the on-off timing of a switch as will be discussed later, so that it becomes possible for the A-D converter circuit 12 to sample the analog signal Vin at the same timing as with the first amplifier circuit 11. As a result, the conversion accuracy of the A-D converter circuit 12 can be improved. Also, since the provision of a sample-and-hold circuit anterior to the A-D converter circuit 12 is no longer necessary, the circuit scale can be reduced. Also, with the capacitance-input type, a highly accurate conversion can be performed even if the threshold voltage of a transistor included in a comparator varies.

On the other hand, the analog signal which is fed back via the second switch SW2 is sampled and held, so that it is basically a constant value. Accordingly, in the present embodiment, when the A-D converter circuit 12 converts the analog signal inputted via the second switch SW2 to a digital value, the operation type of the A-D converter circuit 12 is set to the gate-input type. This can reduce the required capacity of an amplifier for driving the capacitance and hence the power consumption can be suppressed. Also, since the capacitor is not involved, the comparison operation in the A-D converter circuit 12 becomes faster.

Figure 3:
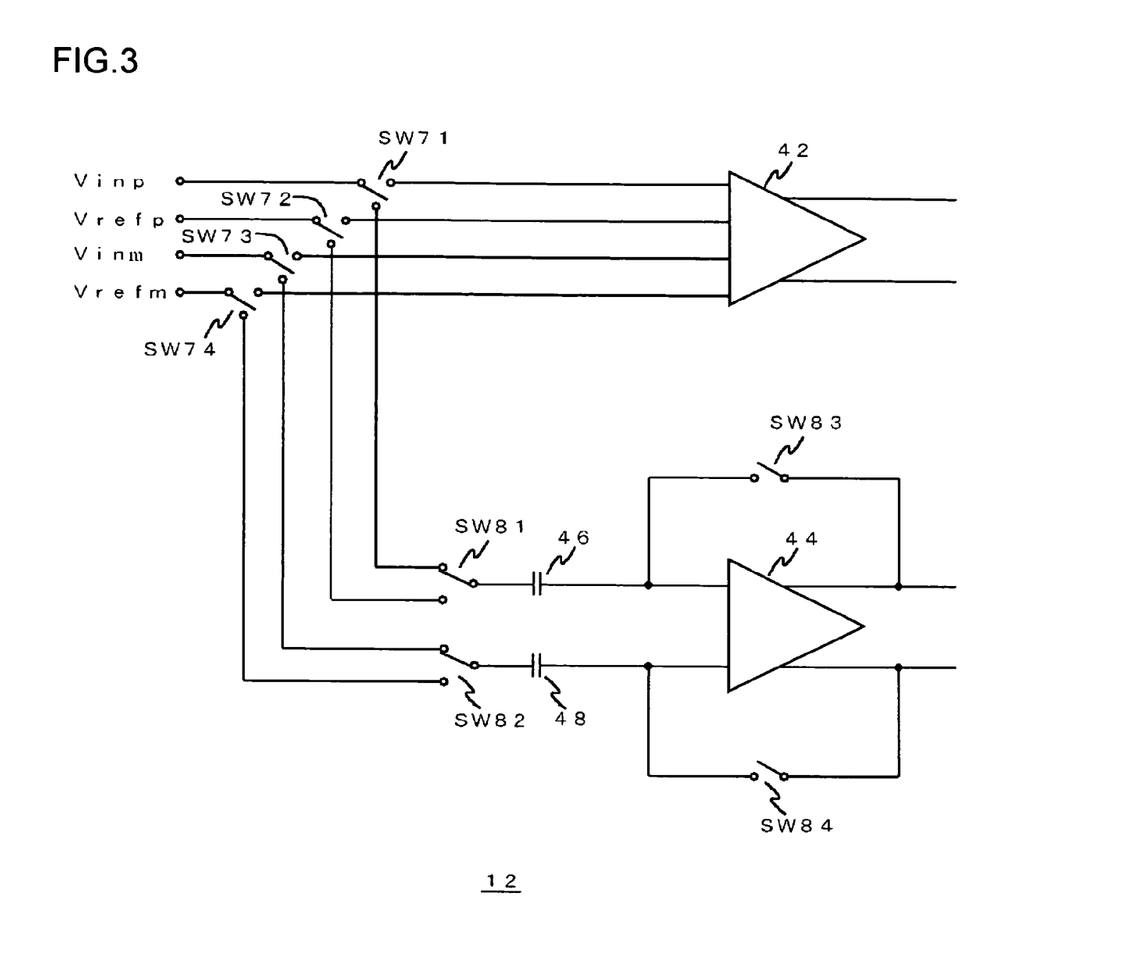
FIG. 3 is a circuit diagram showing a structure of an A-D converter circuit shown in FIG. 1.

FIG. 3 illustrates a structure of the A-D converter circuit 12 shown in FIG. 1. Though a single pair of four-input comparator 42 and two-input comparator 44 is shown in FIG. 3, there are actually a plurality of pairs of four-input comparators 42 and two-input comparators 44 wherein the number of pairs thereof corresponds to the number of reference voltages inputted to the A-D converter circuit 12. The switches SW71 to SW74 input a positive-phase-side analog signal (denoted by Vinp), a positive-phase-side reference voltage (denoted by Vrefp), a reversed-phase-side analog signal (denoted by Vinm) and a reversed-phase-side reference voltage (denoted by Vrefm) selectively to the four-input comparator 42 or the two-input comparator 44. The selection of the switches SW71 to SW74 is controlled by a not-shown type switching signal Vcnt1 from the type control unit 32.

When the A-D converter circuit 12 is to be operated as the gate-input type, the switches SW71 to SW74 select the four-input comparator 42. When the A-D converter circuit 12 is to be operated as the capacitance-input type, the switches SW71 to SW74 select the two-input comparator 44. In the case of the capacitance-input type, the positive-phase-side analog signal Vinp and the positive-phase-side reference voltage Vrefp are inputted selectively to a first capacitor 46 via the switch SW81. The reversed-phase-side analog signal Vinm and the reversed-phase-side reference voltage Vrefm are inputted selectively to a second capacitor 48 via the switch SW82. The switch SW83 and the switch SW84 are turned on during a non-operating period of the two-input comparator 44 and turned off during a comparative operation period of the two-input comparator 44. At the timing when the switch SW83 and the switch SW84 are switched from ON to OFF, the signal inputted then to the first capacitor 46 and the second capacitor 48 is sampled.

Figure 4:
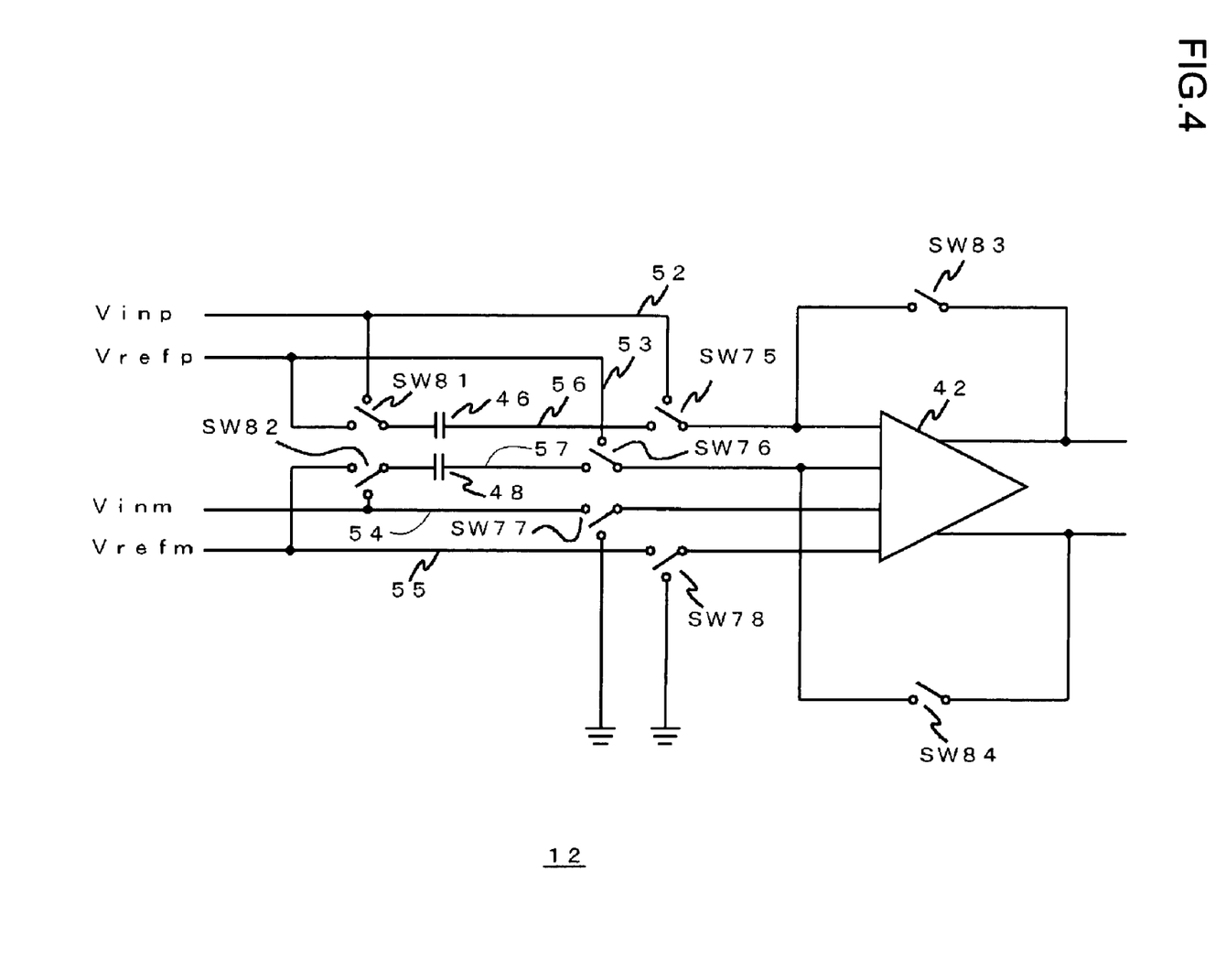
FIG. 4 is a circuit diagram showing another structure of an A-D converter circuit shown in FIG. 1.

FIG. 4 illustrates another structure of the A-D converter circuit 12 shown in FIG. 1. In FIG. 4, components identical or similar to those in FIG. 3 are given the same reference numerals as in FIG. 3 and the explanation thereof is omitted as appropriate. Though a single four-input comparator 42 is shown in FIG. 4, there are actually a plurality of four-input comparators 42 wherein the number thereof corresponds to the number of reference voltages inputted to the A-D converter circuit 12. The A-D converter circuit 12 shown in FIG. 4 includes a four-input comparator 42, switches SW75 to SW78, a first gate-input path 52 to a fourth gate-input path 55, a first select-input path 56, a second select-input path 57, a first capacitor 46, a second capacitor 48, and switches SW81 to SW84.

The first gate-input path 52 is a path in which the positive-phase-side analog signal Vinp is inputted fixedly. The second gate-input path 53 is a path in which the positive-phase-side reference voltage Vrefp is inputted fixedly. The third gate-input path 54 is a path in which the reversed-phase-side analog signal Vinm is inputted fixedly. The fourth gate-input path 55 is a path in which the reversed-phase-side reference voltage Vrefm is inputted fixedly. The first select-input path 56 is a path in which either the positive-phase-side analog signal Vinp or the positive-phase-side reference voltage Vrefp is selectively inputted via the first capacitor 46 by switching therebetween. The second select-input path 57 is a path in which either the reversed-phase-side analog signal Vinm or the reversed-phase-side reference voltage Vrefm is selectively inputted via the second capacitor 48 by switching therebetween. The switches SW75 to SW78 are switches that select a path connected to the input terminal of the four-input comparator 42. The selection in the switches SW75 to SW78 is controlled by a type switching signal Vcnt1 (not shown) from the type control unit 32.

When the A-D converter circuit 12 is to be operated as the gate-input type, the switches SW75 to SW78 select the first gate-input path 52 to the fourth gate-input path 55 as paths connected to the input terminal of the four-input comparator 42. When the A-D converter circuit 12 is to be operated as the capacitance-input type, the switches SW75 and SW76 select the first select-input path 56 and the second select-input path 57 as paths connected to the input terminal of the four-input comparator 42. The switches SW77 and SW78 have the input terminals of the four-input comparator 42 connected to the ground. According to the configuration shown in FIG. 4, the four-input comparator 42 is shared when the A-D converter circuit 12 is to be operated as the gate-input type and when the A-D converter circuit 12 is to be operated as the capacitance-input type. Thereby, the circuit scale can be reduced.

Figure 5:
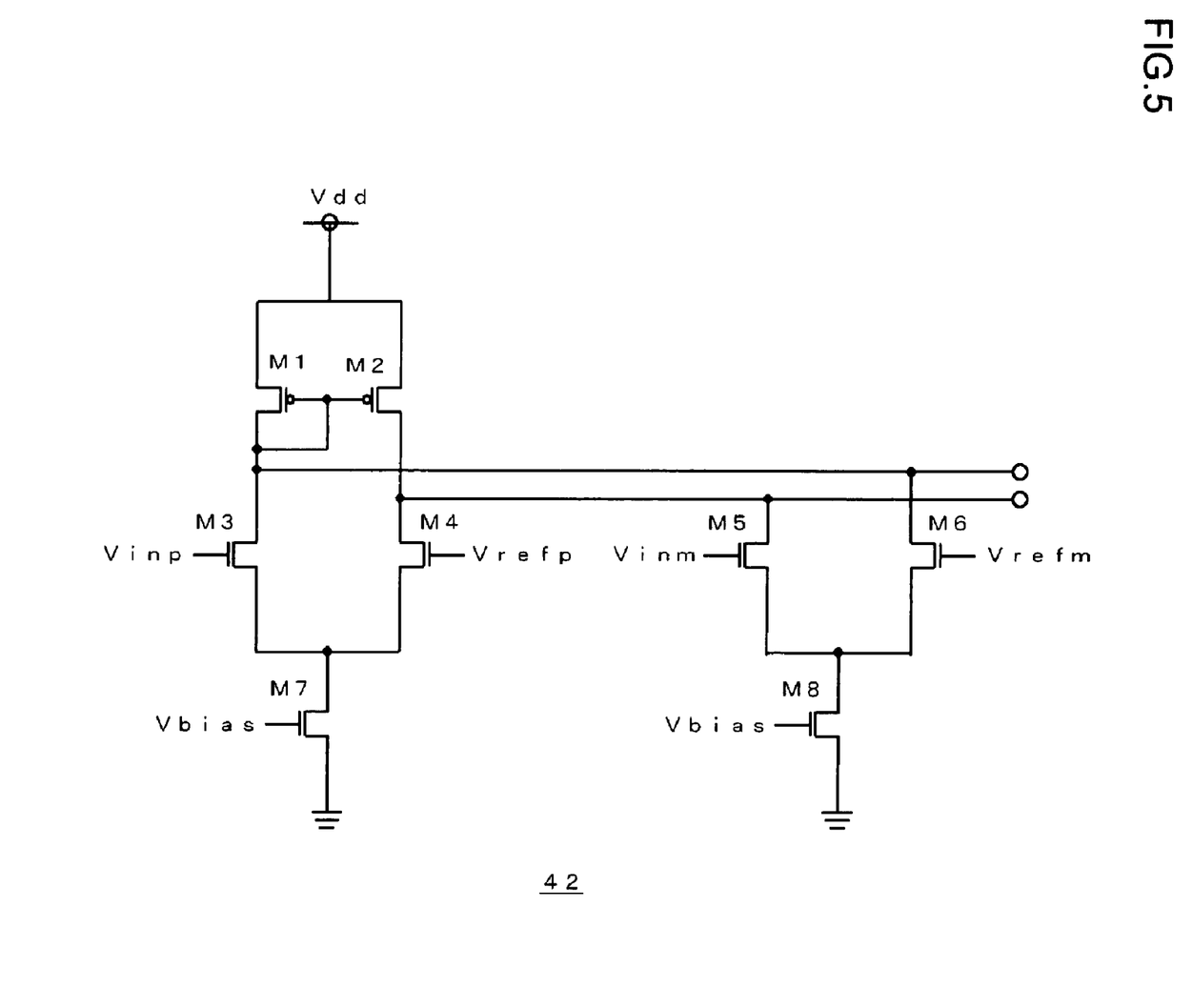
FIG. 5 is a circuit diagram showing a structure of a four-input comparator shown in FIG. 3 and FIG. 4.

FIG. 5 illustrates a structure of the four-input comparator shown in FIG. 3 and FIG. 4. Only the differential amplifier part of the four-input comparator 42 is shown in FIG. 5, and components provided posterior to the differential amplifier is omitted in FIG. 5. The comparator contained in the A-D converter 12 includes a first transistor M1 to an eighth transistor M8. The first transistor M1 and the second transistor M2 are MOSFETs (Metal Oxide Semiconductor Filed Effect Transistors) of P channel type. The third transistor M3 to the eighth transistor M8 are MOSFETs of N channel type.

The source of the first transistor M1 and the source of the second transistor M2 are connected with a power supply line. The gate of the first transistor M1 as a control terminal and the gate of the second transistor M2 as a control terminal are connected with the drain of the first transistor M1. That is, the first transistor M1 and the second transistor M2 constitute a current-mirror circuit. The drain of the first transistor M1 is connected with the drain of the third transistor M3 and the drain of the sixth transistor M6. The drain of the second transistor M2 is connected with the drain of the fourth transistor M4 and the drain of the fifth transistor M5. The source of the third transistor M3 and the source of the fourth transistor M4 are connected to ground by way of the seventh transistor M7. The source of the fifth transistor M5 and the source of the sixth transistor M6 are connected to ground by way of the eighth transistor M8.

Bias voltages Vbias are inputted respectively to the gates of the seventh transistor M7 and the eighth transistor M8 serving as control terminals. The seventh transistor M7 and the eighth transistor M8 each operates as a constant-current source. The positive-phase-side analog signal Vinp is inputted to the gate of the third transistor M3 serving as a control terminal. The positive-phase-side reference voltage Vrefp is inputted to the gate of the fourth transistor M4 serving as a control terminal. The reversed-phase-side analog signal Vinm is inputted to the gate of the fifth transistor M5 serving as a control terminal. The reversed-phase-side reference voltage Vrefm is inputted to the gate of the sixth transistor M6 serving as a control terminal. The voltages at the drains of the fourth transistor M4 and the fifth transistor M5 are the output in the positive-phase side. The voltages at the drains of the third transistor M3 and the sixth transistor M6 are the output in the reversed-phase side.

With a structure described in FIG. 4, when the A-D converter circuit 12 operates under the gate-input type, the positive-phase-side analog signal Vinp and the positive-phase-side reference voltage Vrefp are inputted to the control terminals of the third transistor M3 and fourth transistor M4 in the four-input comparator 42, respectively. Also, the reversed-phase-side analog signal Vinm and the reversed-phase-side reference voltage Vrefm are inputted to the control terminals of the fifth transistor M5 and sixth transistor M6, respectively. When, on the other hand, the A-D converter circuit 12 operates under the capacitance-input type, either one of the positive-phase-side analog signal Vinp and the positive-phase-side reference voltage Vrefp is inputted selectively to the control terminal of the third transistor M3. Also, either one of the reversed-phase-side analog signal Vinm and the reversed-phase-side reference voltage Vrefm is inputted selectively to the control terminal of the fourth transistor M4. Also, the control terminals of the fifth transistor M5 and sixth transistor M6 are connected to the ground. By implementing this configuration, the four-input comparator 42 can also be operated as a two-input comparator, so that the circuit scale of the A-D converter circuit 12 can be reduced.

As explained in FIG. 3, if the two-input comparator 44 is provided separately from the four-input comparator 42, the two-input comparator 44 may be such that the fifth transistor M5, the sixth transistor M6 and the eighth transistor M8 are removed in the configuration of FIG. 5. Though in FIG. 3 to FIG. 5 a description was given of a case where the analog signal is differentially inputted, it is obvious to the skilled in the art that the structure of FIG. 3 to FIG. 5 can be easily applied to the case of single-ended input.

Figure 6:
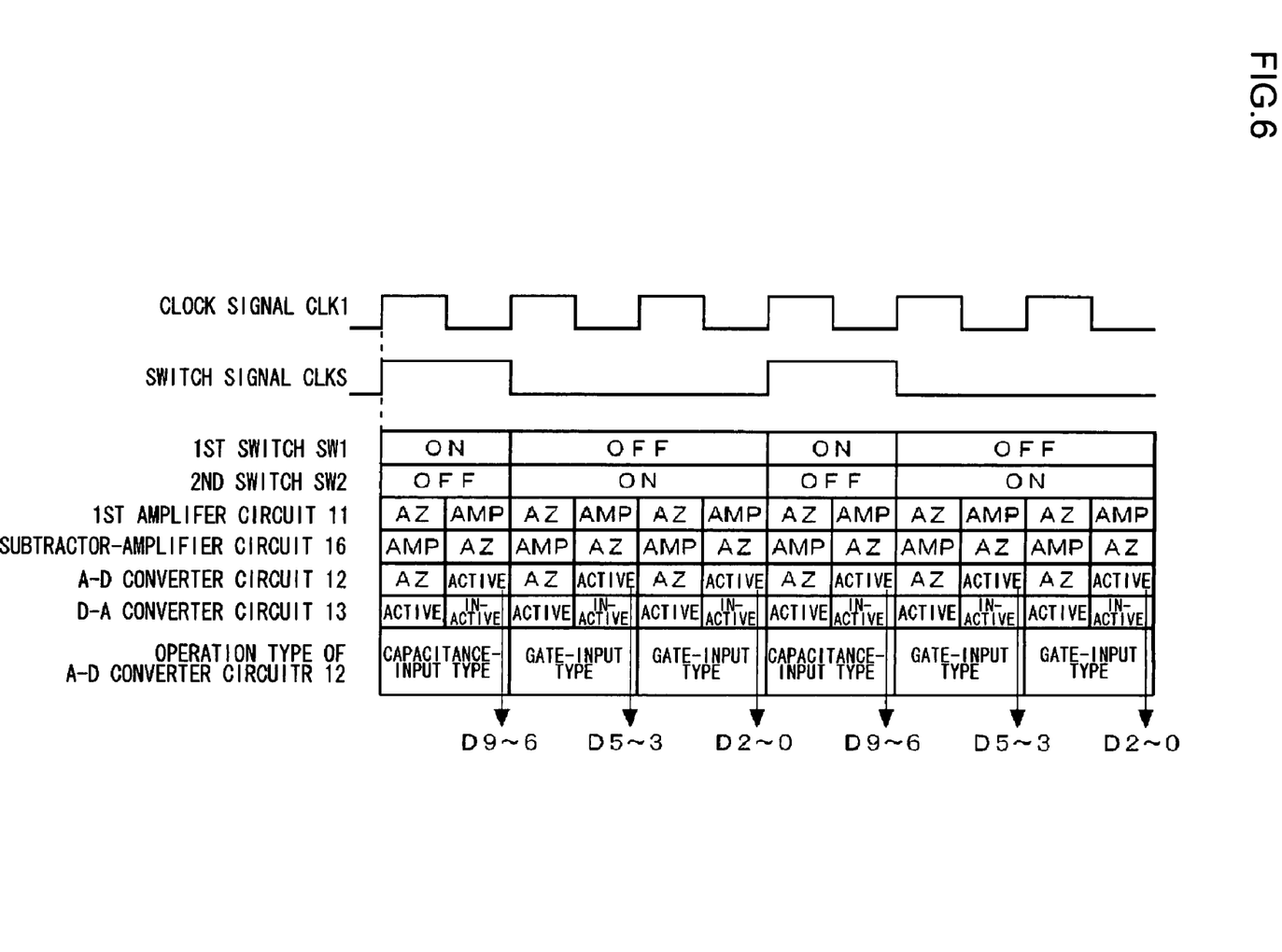
FIG. 6 is a timing chart showing an operation of an A-D converter shown in FIG. 1.

An operation of the A-D converter 100 configured as above will now be described. FIG. 6 is a timing chart illustrating an operation of the A-D converter 100 shown in FIG. 1. The operation will be described starting from the top of FIG. 6 downward. Two signal waveforms are a clock signal CLK1 and a switch signal CLKS. The clock signal CLK1 controls the operations of the first amplifier circuit 11, the substractor-amplifier circuit 16, the A-D converter circuit 12 and the D-A converter circuit 13. The switch signal CLKS controls the ON and OFF of the first switch SW1 and the second switch SW2.

The first switch SW1 is turned on when the switch signal CLKS is in a high level, whereas it is turned off when the switch signal CLKS is in a low level. The second switch SW2 is turned on when the switch signal CLKS is in a low level, whereas it is turned off when the switch signal CLKS is in a high level.

When the clock signal CLK1 is in a low level, the first amplifier circuit 11 amplifiers an analog signal inputted then and outputs the amplified signal to the subtraction circuit 14. When the clock signal CLK1 is in a high level, the first amplifier circuit 11 performs an autozero operation. The substractor-amplifier circuit 16 amplifiers an analog signal inputted when the clock signal CLK1 is in a high level, and outputs the amplified signal to the first amplifier circuit 11 and the A-D converter circuit 12. When the clock signal CLK1 is in a low level, the subtractor-amplifier circuit 16 performs an autozero operation. When the clock signal CLK1 is in a low level, the A-D converter circuit 12 performs a conversion operation so as to output digital values, whereas when the clock signal CLK1 is in a high level, the A-D converter circuit 12 performs an autozero operation. When the clock signal CLK1 is in a high level, the D-A converter circuit 13 converts the output of the A-D converter circuit 12 into analog values, whereas when the clock signal CLK1 is in a low level, the D-A converter circuit 13 becomes indeterminate or inactive.

The type of operation performed by the A-D converter circuit 12 at the time of conversion to the higher 4 bits (D9 to D6) is the capacitance-input type. On the other hand, the type of operation performed by the A-D converter 12 at the time of conversion to the higher 5th to 7th bits (D5 to D3) and the higher 8th to 10th bits (D2 to D0) from the most significant bit is so controlled as to be the gate-input type. The switching of the operation type is done based on a control by the above-described type control unit 32.

According to the first embodiment as described above, when the A-D converter circuit 12 performs a conversion to the higher four bits (D9 to D6), the A-D converter circuit 12 is operated under the capacitance-input type, so that the conversion accuracy can be raised. On the other hand, when the A-D converter circuit 12 performs a conversion to the higher 5th to 7th bits (D5 to D3) and the higher 8th to 10th bits (D2 to D0) from the most significant bit, the A-D convert circuit 12 is operated under the gate-input type, so that the power consumption can be suppressed. Thus, the structure of the A-D converter 100 can be optimized to meet two demands of the improvement in conversion accuracy and the reduction in power consumption in a balanced manner.

Second Embodiment

In the first embodiment, a description has been given of a case where the capacitance-input type, in which either one of the analog signal and the reference voltage is inputted selectively to a comparator by way of a capacitor, and the gate-input type, in which the analog signal and the reference voltage are fixedly inputted to a comparator without involving a capacitor, are used in combination in one A-D converter circuit. Assumed in a second embodiment is a structure in which the analog signal is converted to a digital value in a plurality of steps and stages sequentially from the high-order bits. An A-D converter circuit in an initial stage is operated as the above-described capacitance-input type and an A-D converter circuit in the next stage is operated as the gate-input type. Thereby, similar to the first embodiment, the structure of the A-D converter can be optimized by utilizing the advantages of the capacitance-input type operation and the gate-input type operation.

Figure 7:
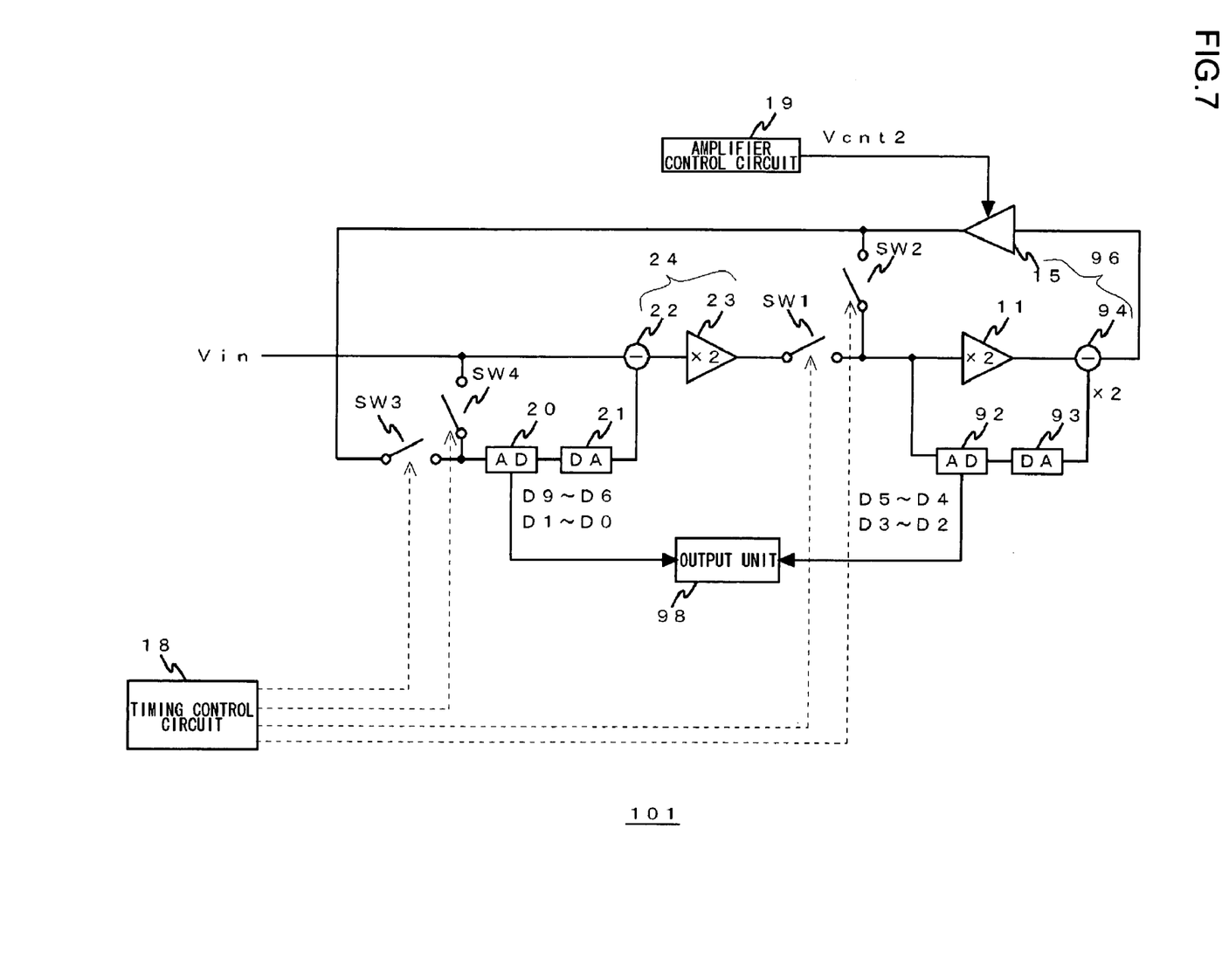
FIG. 7 is a circuit diagram showing a structure of an A-D converter according to a second embodiment of the present invention.

FIG. 7 illustrates a structure of an A-D converter 101 according to the second embodiment of the present invention. In FIG. 7, components identical or similar to those in FIG. 1 are given the same or like reference numerals as those of FIG. 1, and the explanation thereof will be omitted as appropriate. The A-D converter 101 of FIG. 7 is configured such that a circuit that outputs the higher 4 bits (D9 to D6) and the least significant 2 bits (D1 and D0) is added anterior to the cyclic type A-D converter 100 of FIG. 1. As a result, the operation of the A-D converter 101 can be made faster.

In addition to the components of the A-D converter 100 shown in FIG. 1, the A-D converter 101 further includes a third switch SW3, a fourth switch SW4, a second A-D converter circuit 20, a second D-A converter circuit 21, a second subtraction circuit 22, and a third amplifier circuit 23. In the A-D converter 101, an analog signal Vin is inputted to the second A-D converter circuit 20 via the fourth switch SW4. The second A-D converter circuit 20 converts the inputted analog signal to a digital value of maximum 4 bits, and then outputs the digital value to a not-shown encoder and the second D-A converter circuit 21. The second D-A converter circuit 21 converts the digital value of maximum 4 bits to an analog signal.

The second subtraction circuit 22 subtracts the output of the second D-A converter circuit 21 from the analog signal Vin. The third amplifier circuit 23 amplifies the output of the second subtraction circuit 22. The output of the third amplifier circuit 23 is outputted, via the first switch SW1, to the first amplifier circuit 11 and the first A-D converter circuit 92. The gain of the third amplifier circuit 23 is 2×. Note that a second subtractor-amplifier circuit 24, which is an amplifier circuit provided with a subtraction function, may be used in place of the second subtraction circuit 22 and the third amplifier circuit 23. Also, a sample-and-hold circuit may be inserted anterior to the second subtraction circuit 22. In the example of FIG. 7, the subtraction is performed by adjusting the timing of input to the second subtractor-amplifier circuit 24.

The first A-D converter circuit 92 converts the inputted analog signal to a digital value of maximum 2 bits and then outputs the digital value to the first D-A converter circuit 93. The first D-A converter circuit 93 converts the digital value of maximum 2 bit outputted from the first A-D converter circuit 92 to an analog signal. Here, the analog value outputted from the first D-A converter circuit 93 is amplified by a factor of 2 in accordance with the gain of the first amplifier circuit 11.

The first amplifier circuit 11 samples the inputted analog signal and holds it and then amplifies it by a factor of 2 and outputs the amplified signal to the first subtraction circuit 94. The first subtraction circuit 94 subtracts the analog value outputted from the first D-A converter circuit 93, from the analog value outputted from the first amplifier circuit 11. Here, the analog value outputted from the first D-A converter circuit 93 is amplified by a factor of 2 in accordance with the gain of the first amplifier circuit 11. The second amplifier circuit 15 amplifies the output of the first subtraction circuit

94. The gain of the second amplifier circuit 15 is controlled by an amplification control signal Vcnt2 outputted from the amplifier control circuit 19. The output of the second amplifier circuit 15 is fed back to the first amplifier circuit 11 and the first A-D converter circuit 92 via the second switch SW2. Or, the output of the second amplifier circuit 15 is fed back to the second A-D converter 20 via the third switch SW3. Note that a subtractor-amplifier circuit 96 which is an amplifier circuit having a subtraction function may be used in place of the first subtraction circuit 94 and the second amplifier circuit 15.

In the first step, which is the initial step of conversion, the fourth switch SW4 is turned on and the third switch SW3 is turned off. In the first step, the second A-D converter circuit 20 generates values of the higher 1st to 4th bits (D9 to D6), counted from the most significant bit, among the digital values of 10 bits that the A-D converter 101 will output finally. In the second step, the first switch SW1 is turned on and the second switch SW2 is turned off. In the second step, the first A-D converter circuit 92 generates values of the higher 5th and 6th bits (D5 and D4), from the most significant bit, among the digital values of 10 bits that the A-D converter 101 will output finally. In the third step, the second switch SW2 is turned on and the first switch SW1 is turned off. In the third step, the first A-D converter circuit 92 generates values of the higher 7th and 8th bits (D3 and D2), from the most significant bit, among the digital values of 10 bits that the A-D converter 101 will output finally. In the fourth step, the third switch SW3 is turned on and the fourth switch SW4 is turned off. In the fourth step, the second A-D converter circuit 20 generates values of the higher 9th and 10th bits (D1 and D0), from the most significant bit, among the digital values of 10 bits that the A-D converter 101 will output finally.

The digital values (D9 to D6, D5 and D4, D3 and D2, D1 and D0) outputted sequentially from the first A-D converter circuit 92 and the second A-D converter circuit 20 are inputted to the output unit 98. The output unit 98 corrects the inputted digital values, based on a redundancy range described later. The output unit 98 outputs the corrected digital values parallely.

Redundancy ranges are assigned in the conversion by the first A-D converter circuit 92 in the second and the third step and in the conversion by the second A-D converter circuit 20 in the fourth step. Thus, the result of conversion in the first to third steps can be corrected based on the result of conversion by the A-D conversion circuit in the second to fourth steps.

The amplifier control circuit 19 controls the gain of the second amplifier circuit 15 according as the output of the second amplifier circuit 15 is either fed back to the first A-D converter circuit 92 or the second A-D converter 20. More specifically, if the second amplifier circuit 15 feeds back the output thereof to the first A-D converter 92, the amplifier control circuit 19 will perform a control so that the gain of the second amplifier circuit 15 is 2×. If, on the other hand, the second amplifier circuit 15 feeds back the output thereof to the second A-D converter 20, the amplifier control circuit 19 will perform a control so that the gain of the second amplifier circuit 15 is 4×.

The type control unit 32 described in conjunction with FIG. 1 in the first embodiment is not provided in the second embodiment. This is because in the second embodiment the second A-D converter circuit 20 is fixed as the capacitance-input type and the first A-D converter circuit 92 is fixed as the gate-input type. In the case of the second embodiment, the four-input comparator 42 described in conjunction with FIG. 3 to FIG. 5 may be used as a comparator used for the second A-D converter circuit 20. A comparator in which the fifth transistor M5, the sixth transistor M6 and the eighth transistor M8 are excluded from the structure shown in FIG. 5 may be used as a comparator used for the first A-D converter circuit 92.

Figure 8:
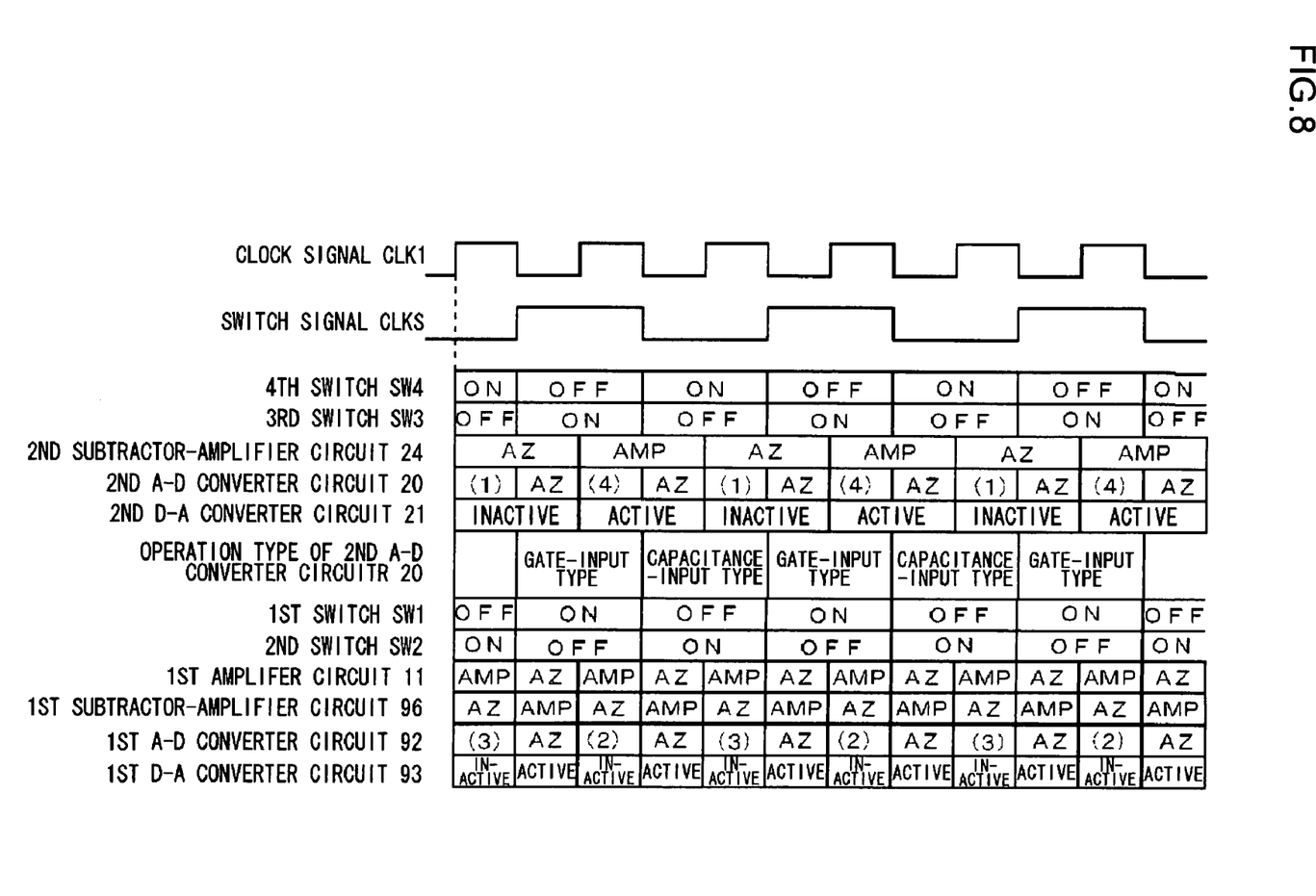
FIG. 8 is a timing chart showing an operation of an entire A-D converter shown in FIG. 7.

An operation of the entire A-D converter 101 structured as above will now be described. FIG. 8 is a timing chart illustrating an entire operation of the A-D converter 101 shown in FIG. 7. The operation will be described starting from the top of FIG. 8 downward. Two signal waveforms are a clock signal CLK1 and a switch signal CLKS. The clock signal CLK1 controls the operations of the first amplifier circuit 11, the first substractor-amplifier circuit 96, the first A-D converter circuit 92, the first D-A converter circuit 93, the second subtractor-amplifier circuit 24, the second A-D converter circuit 20, and the second D-A converter circuit 21. The switch signal CLKS controls the ON and OFF of the first switch SW1 to the fourth switch SW4.

The first switch SW1 and the third switch SW3 are turned on when the switch signal CLKS is in a high level, whereas they are turned off when the switch signal CLKS is in a low level. The second switch SW2 and the fourth switch SW4 are turned on when the switch signal CLKS is in a low level, whereas they are turned off when the switch signal CLKS is in a high level.

Every time the clock signal CLK1 transits from a low level to a high level, the operation of amplifying the inputted analog signal and the autozero operation are switched therebetweeen in the second subtractor-amplifier circuit 24. The second A-D converter circuit 20 carries out a conversion operation when the clock signal CLK1 is high, whereas it carries out an autozero operation when the clock signal CLK1 is low. Every time the clock signal CLK1 transits from a low level to a high level, the state in which the D-A conversion is executed and the indeterminate (inactive) state are switched therebetweeen in the second D-A converter circuit 21.

When the clock signal CLK1 is in a high level, the first amplifier circuit 11 amplifies an inputted analog signal and then outputs the amplified signal to the subtraction circuit 14. When the clock signal CLK1 is in a low level, the first amplifier circuit 11 performs an autozero operation. The first subtractor-amplifier circuit 96 amplifiers the analog signal inputted when the clock signal CLK1 is in a low level. When the clock signal CLK1 is in a high level, the first subtractor-amplifier circuit 96 performs an autozero operation. When the clock signal CLK1 is in a high level, the first A-D converter circuit 92 performs a conversion operation so as to output a digital value, whereas when the clock signal CLK1 is in a low level, the first A-D converter circuit 92 performs an autozero operation. When the clock signal CLK1 is in a low level, the first D-A converter circuit 93 performs a D-A conversion, whereas when the clock signal CLK1 is in a high level, the first D-A converter circuit 93 becomes indeterminate or inactive.

According to the third embodiment, the second A-D converter circuit 20 is fixed as the capacitance-input type and the first A-D converter circuit 92 is fixed as the gate-input type, so that the conversion to the higher 4 bits (D9 to D6) is performed in the second A-D converter circuit 20 that operates under the capacitance-input type. As a result, even if the analog signal Vin, to be converted, which is inputted via the fourth switch SW4, varies constantly, the analog signal Vin can be sampled at a desired timing. Hence, the conversion accuracy can be enhanced. On the other hand, the conversion to the higher 5th and 6th bits (D5 and D4) and the higher 7th and 8th bits (D3 and D2) from the most significant bit is performed in the first A-D converter circuit 92 that operates under the gate-input type. As a result, the power consumption at the time of converting the analog signal with relatively less variation can be suppressed. Furthermore, the A-D converter 101 is configured in a manner that a stage where the higher 4 bits (D9 to D6) from the most significant bit and the least significant 2 bits (D1 and D0) are outputted is added anterior to a cyclic type A-D converter. This configuration makes it possible to raise the conversion rate. In this manner, in the structure where the conversion rate is raised, the structure of the A-D converter 101 according to the second embodiment can be optimized to meet two demands of the improvement in conversion accuracy and the reduction in power consumption in a balanced manner.

Third Embodiment

In the second embodiment, assumed was the structure such that the analog signal is converted to the digital values sequentially from the higher bits through a plurality of stages. Then the A-D converter circuit in the first stage is fixed to the aforementioned capacitance-input type and the A-D converter circuit in the next stage is fixed to the aforementioned gate-input type. In a third embodiment, a description will be given of a case where the capacitance input type and the gate-input type are used parallely in the A-D converter in the first stage.

Figure 9:
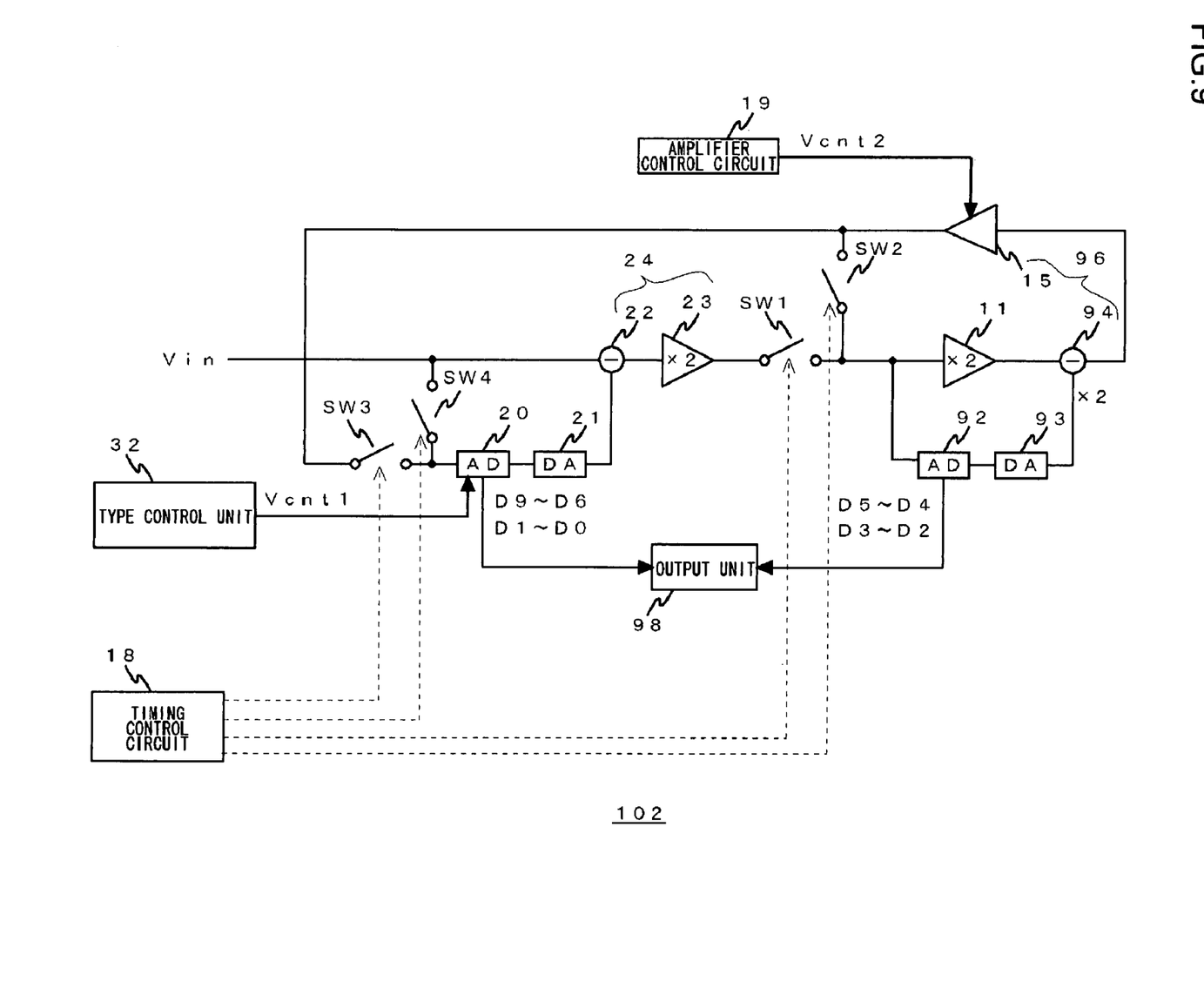
FIG. 9 is a circuit diagram showing a structure of an A-D converter according to a third embodiment of the present invention.

FIG. 9 illustrates a structure of an A-D converter 102 according to the third embodiment. In FIG. 9, components identical oar similar to those in FIG. 7 are given the same reference numerals as in FIG. 7 and the explanation thereof is omitted as appropriate. The A-D converter 102 shown in FIG. 9 differs from the A-D converter 101 shown in FIG. 7 in that in addition to the structure of the A-D converter 101 of FIG. 7 there is provided a type control unit 32 which controls the type of the second A-D converter circuit 20. The operation of the type control unit 32 is the same as that in the first embodiment. That is, to switch the type of the second A-D converter circuit 20, the structure shown in FIG. 3 or FIG. 4 is used in the third embodiment. The type control unit 32 performs a control in a manner that the type of the second A-D converter circuit 20 at the time of conversion to the higher 4 bits (D9 to D6) is set to the capacitance-input type. On the other hand, the type control unit 32 performs a control in a manner that the type of the second A-D converter circuit 20 at the time of conversion to the higher 9th and 10th bits (D1 and D0) from the most significant bit is set to the gate-input type.

According to the third embodiment, the conversion to the higher 4 bits (D9 to D6) are done by the second A-D converter circuit 20 operating under the capacitance-input type. On the other hand, the conversion to the higher 5th and 6th bits (D5 and D4) and the higher 7th and 8th bits (D3 and D2) from the most significant bit is done by the first A-D converter circuit 92 operating under the gate-input type. Further, the conversion to the higher 9th and 10th bits (D1 and D0) from the most significant bit is done by the second A-D converter circuit 20 whose operation type has been switched to the gate-input type. That is, compared with the second embodiment, the conversion to the higher values of 9th and 10th bits (D1 and D0) from the most significant bit is also done by the gate-input type operation in the third embodiment. Thus further reduction in power consumption can be realized.

The embodiments described above are merely exemplary, and it is understood by those skilled in the art that various modifications to the combination of each component and process thereof are possible and such modifications are also within the scope of the present invention.

In the present embodiment, a description has been given of a case where the conversion to the higher 4 bits are done by the A-D converter circuit operating under the capacitance-input type, but the present invention is not limited thereto. For example, in the case where a sample-and-hold circuit is provided on a path of the analog signal Vin, the conversion to the higher 4 bits may be done by the A-D converter circuit under the gate-input type. Also conceivable is that the conversion to the least significant bit to which the correction based on the redundancy range cannot be performed is done by the A-D converter circuit operating under the capacitance-input type so as to raise the conversion accuracy. In summary, whether the operation type is set to the gate-input type or the capacitance-input type in the conversion at each step or stage is preferably determined in consideration of a condition in designing a circuitry, a performance required thereof, the usage setting or the like. In such a case, the flexibility in designing a circuitry is enhanced.

As the operation type of the A-D converter circuit, the capacitance-input type and the gate-input type are explained in the present embodiments. However, the operation type of the A-D converter circuit is not limited thereto, and the capacitance-input type and the gate-input type may be used in a mixed manner in the same step or stage of a conversion. For example, the following mixed type proves effective. That is, if the A-D converter circuit has a plurality of comparators, as an operation of the A-D converter circuit either one of the analog signal and the reference voltage is inputted selectively to a certain comparator among the plurality of comparators via a capacitor and both the analog signal and the reference voltage are inputted, without involving a capacitor, to another comparator among the plurality of comparators.

In the present embodiment, a description has been given of an example where the A-D converter circuit is shared in the conversion processing which is carried out a plurality of times, but the A-D converter circuit may not be put to the common use in the conversion processing performed a plurality of times. That is, the analog signal may instead be pipeline-processed in a manner that the operations undergoes a plurality of stages in a feedforward fashion.

While the preferred embodiments of the present invention have been described using specific terms, such description is for illustrative purposes only, and it is to be understood that changes and variations may be made without departing from the spirit or scope of the appended claims.

What is claimed is:

1. An analog-to-digital converter, which converts an input analog signal to a digital value of a predetermined number of bits, the analog-to-digital converter characterized in that it is configured to be operable by a first mode and second mode wherein the first mode is such that an analog signal is inputted, via a capacitor, to a comparator included in said analog-to-digital converter and the second mode is such that an analog signal is inputted, without involving a capacitor, to a comparator included in said analog-to-digital converter.

2. An analog-to-digital converter, which converts an input analog signal to a digital value of a predetermined number of bits as a result of a plurality of conversions, the analog-to-digital converter comprising:

a conversion unit which converts the input analog signal to a digital value of less than the predetermined number of bits wherein said conversion unit is put to a common use for at least two conversions in a plurality of conversions; and a control unit which switches between a first type and a second type wherein the first type is such that an analog signal is inputted, via a capacitor, to a comparator included in said conversion unit and the second type is such that an analog signal is inputted, without involving a capacitor, to a comparator included in said conversion unit.

3. An analog-to-digital converter according to claim 2, said conversion unit including:
- a differential amplifier;
- a first input path which inputs selectively either the input analog signal or a reference voltage to the differential amplifier via a capacitor;
- a second input path which inputs fixedly either the input analog signal or the reference voltage to the differential amplifier without involving a capacitor; and
- a switch which connects either the first input path or the second input path to an input terminal of the differential amplifier,
- wherein by controlling the switch said control unit switches the path connected to the input terminal of the differential amplifier between the first input path and the second input path.

4. An analog-to-digital converter, which converts an input analog signal to a digital value of a predetermined number of bits as a result of a plurality of conversions through a plurality of stages connected in series, wherein the plurality of stages include:
- a first stage including a first-type conversion unit which has the analog signal inputted to a comparator of the first-type conversion unit via capacitor; and
- a second stage including a second-type conversion unit which has the analog signal inputted to a comparator of the second-type conversion unit without involving a capacitor.

5. An analog-to-digital converter according to claim 4, wherein the first stage is an initial stage in the plurality of stages.

6. An analog-to-digital converter according to claim 5, wherein the conversion unit included in the first stage is shared in two or more conversions in a plurality of conversions, and
- wherein said analog-to-digital converter includes a control unit which switches the type of the conversion unit included in the first stage from the first type to the second type after the first conversion of the two or more conversions has been performed.

7. An analog-to-digital converter according to claim 6, the conversion unit included in the first stage includes:
- a differential amplifier;
- a first input path which inputs selectively either the input analog signal or a reference voltage to the differential amplifier via a capacitor;
- a second input path which inputs fixedly either the input analog signal or the reference voltage to the differential amplifier without involving a capacitor; and
- a switch which connects either the first input path or the second input path to an input terminal of the differential amplifier,
- wherein by controlling the switch said control unit switches the path connected to the input terminal of the differential amplifier, from the first input path to the second input path.

* * * * *